(12) United States Patent
Zhan et al.

(10) Patent No.: US 11,409,149 B2
(45) Date of Patent: Aug. 9, 2022

(54) ELECTRONIC DEVICE

(71) Applicants: Hefei BOE Optoelectronics Technology Co., Ltd., Anhui (CN); BOE Technology Group Co., Ltd., Beijing (CN)

(72) Inventors: Jianghui Zhan, Beijing (CN); Xuemei Zhao, Beijing (CN); Guanghua Hu, Beijing (CN); Guanglei Yang, Beijing (CN); Hu Li, Beijing (CN); Wenyu Zeng, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 160 days.

(21) Appl. No.: 16/760,738

(22) PCT Filed: May 13, 2019

(86) PCT No.: PCT/CN2019/086655
§ 371 (c)(1),
(2) Date: Apr. 30, 2020

(87) PCT Pub. No.: WO2020/227893
PCT Pub. Date: Nov. 19, 2020

(65) Prior Publication Data
US 2021/0405430 A1 Dec. 30, 2021

(51) Int. Cl.
*G02F 1/1333* (2006.01)
*G02F 1/1335* (2006.01)
(Continued)

(52) U.S. Cl.
CPC .... *G02F 1/133322* (2021.01); *G02F 1/13452* (2013.01); *G02F 1/133305* (2013.01);
(Continued)

(58) Field of Classification Search
CPC .................................................. G02F 1/133305
See application file for complete search history.

(56) References Cited

U.S. PATENT DOCUMENTS 10,693,089 B2    6/2020   He et al.
2017/0222179 A1  8/2017   Park
(Continued)

FOREIGN PATENT DOCUMENTS

CN    102865516 A    1/2013
CN    108010448 A    5/2018
(Continued)

*Primary Examiner* — Edmond C Lau
(74) *Attorney, Agent, or Firm* — Banner & Witcoff, Ltd.

(57) ABSTRACT

An electronic device includes a first base substrate, a flexible member, and a bending auxiliary structure. The first base substrate includes a first side. The flexible member includes a first end, a second end opposite to the first end, and a main body portion located between the first end and the second end. The first end is connected to the first base substrate at the first side. The bending auxiliary structure is provided at the first side and including at least one curved surface. The main body portion of the flexible member is bent around the at least one curved surface of the bending auxiliary structure, so that the first end and the main body portion or the first end and the second end are at least partially overlapped in a direction perpendicular to the first base substrate.

12 Claims, 4 Drawing Sheets

(51) Int. Cl.
*G02F 1/13357* (2006.01)
*G02F 1/1345* (2006.01)

(52) U.S. Cl.
CPC .. *G02F 1/133528* (2013.01); *G02F 1/133606* (2013.01); *G02F 1/133612* (2021.01)

(56) References Cited

U.S. PATENT DOCUMENTS

2019/0302529 A1    10/2019   Zha et al.
2021/0033911 A1*    2/2021   Ito ......................... H05K 1/189
2021/0080771 A1*    3/2021   Tezen .................... H05K 1/189

FOREIGN PATENT DOCUMENTS

| CN | 108198842 A | 6/2018 |
| CN | 108445675 A | 8/2018 |
| KR | 20180061961 A | 6/2018 |

* cited by examiner

ELECTRONIC DEVICE

The application is a U.S. National Phase Entry of International Application No. PCT/CN2019/086655 filed on May 13, 2019, designating the United States of America. The present application claims priority to and the benefit of the above-identified application and the above-identified application is incorporated by reference herein in its entirety.

TECHNICAL FIELD

Embodiments of the present disclosure relate to an electronic device.

BACKGROUND

Some electronic devices include flexible members. In the assembly of electronic devices, it is necessary to bend a flexible member to turn a member connecting to an end of the flexible member from one side of a base substrate to another side of the base substrate. However, the flexible member being bent may be damaged.

SUMMARY

At least one embodiment of the present disclosure provides an electronic device, which includes: a first base substrate, a flexible member, and a bending auxiliary structure. The first base substrate includes a first side. The flexible member includes a first end, a second end opposite to the first end, and a main body portion located between the first end and the second end. The first end is connected to the first base substrate at the first side. The bending auxiliary structure is provided at the first side and including at least one curved surface. The main body portion of the flexible member is bent around the at least one curved surface of the bending auxiliary structure.

For example, in at least one embodiment, the first end of the flexible member and the main body portion or the second end are at least partially overlapped in a direction perpendicular to the first base substrate.

For example, in at least one embodiment, the first base substrate further includes a bonding region provided on the first side. The flexible member is a flexible printed circuit board, and the first end is bonded to the bonding region of the first base substrate.

For example, in at least one embodiment, the first base substrate includes a first plate surface and a second plate surface opposite to the first plate surface, the bonding region is located in the first plate surface. The flexible printed circuit board is bent around the bending auxiliary structure such that the second end is located at a side of the second plate surface.

For example, in at least one embodiment, the electronic device further includes an integrated circuit chip. The second end is connected to the integrated circuit chip.

For example, in at least one embodiment, the electronic device further includes a second base substrate. The second base substrate is stacked on a side of the first plate surface of the first base substrate, and the first base substrate is an array substrate.

For example, in at least one embodiment, the electronic device further includes a second base substrate. The first base substrate and the second base substrate are stacked. The second base substrate includes a third plate surface, and the third plate surface faces away from the first base substrate. The flexible member is bent around the bending auxiliary structure such that the second end is located on a side of the third plate surface.

For example, in at least one embodiment, the first base substrate is a light guide plate, and the light guide plate includes a light guide plate connection portion provided at the first side. The flexible member is a flexible light mix portion, and the first end is connected to the light guide plate connection portion of the first base substrate to allow a light emitted by the flexible light mix portion to enter the light guide plate.

For example, in at least one embodiment, the electronic device further includes a light source module. The light source module is connected to the second end, and configured such that the light emitted by the flexible light mix portion can be incident into the flexible light mix portion.

For example, in at least one embodiment, the electronic device further includes a display panel, including a light emitting side and a back side opposite to the light emitting side. The first base substrate is provided at the light emitting side of the display panel. The flexible light mix portion is bent around the bending auxiliary structure such that the second end is located at the back side of the display panel.

For example, in at least one embodiment, the display panel is a reflective display panel.

For example, in at least one embodiment, the at least one curved surface is a partial cylindrical surface, a partial elliptic cylindrical surface, or a partial parabolic cylindrical surface.

For example, in at least one embodiment, the bending auxiliary structure further includes an extension surface. The extension surface is connected to the at least one curved surface, and the main body portion of the flexible member is extended along the extension surface after being bent around the at least one curved surface.

For example, in at least one embodiment, at least a part of the main body portion of the flexible member is in contact with the at least one curved surface, so as to be bent around the at least one curved surface.

For example, in at least one embodiment, the at least part of the main body portion in contact with the at least one curved surface is in contact and engagement with the at least one curved surface.

For example, in at least one embodiment, the bending auxiliary structure further includes a combination portion, the combination portion includes a concave portion which is configured to contact at least one of plate-shaped members which are crossed by the flexible portion when the flexible portion is bent, so as to position the bending auxiliary structure at a side surface of the at least one of plate-shaped members which are crossed by the flexible portion when the flexible portion is bent.

For example, in at least one embodiment, in a direction perpendicular to the first base substrate, a thickness of the bending auxiliary structure is greater than or equal to a thickness of the at least one of plate-shaped members which are crossed by the flexible portion when the flexible portion is bent.

BRIEF DESCRIPTION OF THE DRAWINGS

In order to clearly illustrate the technical solution of the embodiments of the present disclosure, the drawings of the embodiments will be briefly described in the following. It should be understood that the following drawings show only some embodiments of the present disclosure, and therefore should not be considered as limiting the scope of the present disclosure. For those of ordinary skill in the art, on the premise of not paying creative labor, other relevant drawings can be obtained according to these drawings.

DETAILED DESCRIPTION

Figure 1A:
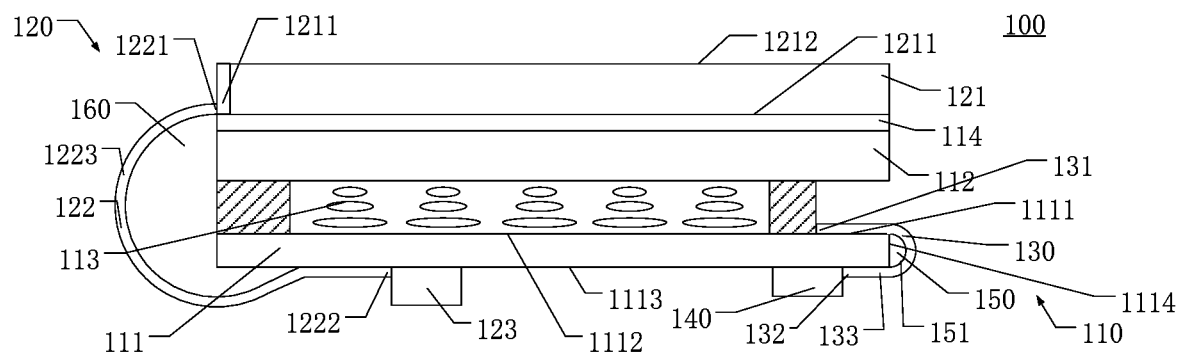
FIG. 1A shows a cross-sectional view of at least a part of a display device according to at least one embodiment of the present disclosure.

In order to make the objects, technical schemes and advantages of the present disclosure more clear, the technical scheme of the embodiments of the present disclosure will be clearly and completely describe in conjunction with the accompanying drawings of the embodiments of the present disclosure. Obviously, described embodiments are part of the embodiments of the present disclosure, not all of the embodiments. Based on the described embodiments of the present disclosure, all of other embodiments acquired by those skilled in the art without the need for creative work are fall within the scope of the protection of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

At least one embodiment of the present disclosure provides an electronic device, which includes: a first base substrate, a flexible member, and a bending auxiliary structure. The first base substrate includes a first side. The flexible member includes a first end, a second end opposite to the first end, and a main body portion located between the first end and the second end. The first end is connected to the first base substrate at the first side. The bending auxiliary structure is provided at the first side of the first base substrate and including at least one curved surface. The main body portion of the flexible member is bent around the at least one curved surface of the bending auxiliary structure, so as to enable the first end and the main body portion or the first end and the second end are at least partially overlapped in a direction perpendicular to the first base substrate.

In the above described embodiments of the present disclosure, because the bending auxiliary structure is provided, the flexible member is bent and the at least one curved surface of the bending auxiliary structure supports the main body portion of the flexible member being bent, therefore, it is possible to prevent the flexible member from being damaged after being bent.

For example, the first base substrate includes a first plate surface and a second plate surface opposite to the first base substrate, and the first end of the flexible member may be connected to the first base substrate via the first plate surface or the second plate surface.

For example, the electronic device further includes a second base substrate. The first base substrate and the second base substrate are stacked. After the flexible member being bent, the second end of the flexible member may be positioned on a side of the first base substrate or on a side of the second base substrate.

For example, the electronic device according to at least one embodiment of the present disclosure may be a display device, a light emitting device, a touch panel, etc. The following description takes the display device as an example, but the embodiments of the present disclosure is not limited thereto.

FIG. 1A shows a cross-sectional view of at least a part of a display device 100 according to at least one embodiment of the present disclosure. As shown in FIG. 1A, the display device 100 includes a front light module 120, a display panel 110, a flexible printed circuit board (FPC) 130, an integrated circuit chip 140, a first bending auxiliary structure 150, and a second bending auxiliary structure 160.

The display panel 110 includes an array substrate 111, a liquid crystal layer 113, a color film substrate 112, and a polarizer 114. The array substrate 111 is an example of a first base substrate of the embodiments of the present disclosure. The color film substrate 112 is an example of a second base substrate of the embodiments of the present disclosure. The flexible printed circuit board 130 is an example of a flexible member of the embodiments of the present disclosure. The first bending auxiliary structure 150 is an example of a bending structure of the embodiments of the present disclosure. The display panel 110 may be, for example, a reflective display panel. Accordingly, the array substrate 111 may be, for example, a reflective array substrate. For example, the liquid crystal layer 113 is provided between the array substrate 111 and the color film substrate 112, and the polarizer 114 is provided at the side of the liquid crystal layer 113 away from the array substrate 111. For example, as shown in FIG. 1A, in the present embodiment, the polarizer 114 is provided on the color film substrate 112, and the front light module 120 is further stacked on the polarizer 114.

For the reflective display panel 110, ambient light or light provided by the front light module 120 enters from the light incident side (the upper side in FIG. 1A) of the display panel 110, through the polarizer 114 and forms incident polarized light having a first polarization direction. The incident polarized light enters the liquid crystal layer 113 and is then reflected by the reflective layer of the reflective array substrate 111 to form reflected polarized light. For example, when no voltage is applied to the upper side of the liquid crystal layer 113 and the lower side of the liquid crystal layer 113, the liquid crystal layer 113 is configured such that the reflected polarized light still has the first polarization direction. The reflected polarized light can pass through the polarizer 114, and in this case, the display panel 110 is in a normally white state. For example, when a voltage is applied to the upper side of the liquid crystal layer 113 and the lower side of the liquid crystal layer 113, liquid crystal molecules rotate so that the reflected polarized light has a second polarization direction perpendicular to the first polarization direction. Because the reflected polarized light has the second polarization direction, the reflected polarized light will not pass through the polarizer 114 or partially pass through the polarizer 114, thereby achieving gray scale display.

In other embodiments, a phase difference film, such as a quarter wavelength film, may further be provided between the polarizer 114 and the color film substrate 112. In this case, when no voltage is applied to the upper side of the liquid crystal layer 113 and the lower side of the liquid crystal layer 113, the liquid crystal layer 113 and the phase difference film are configured such that the reflected polarized light has a second polarization direction perpendicular to the first polarization direction. The reflected polarized light cannot pass through the polarizer 114, and the display panel 110 is in a normally black state. When a voltage is applied to the upper side of the liquid crystal layer 113 and the lower side of the liquid crystal layer 113, liquid crystal molecules rotate, and the liquid crystal layer 113 and the phase difference film are configured such that the reflected polarized light has the first polarization direction, and the reflected polarized light can pass through the polarizer 114 or partially pass through the polarizer 114, thereby achieving gray scale display.

The display panel 110 may further include other members, such as a timing controller, a power management circuit, a gate drive circuit, a data drive circuit, etc., and the embodiments of the present disclosure are not limited thereto.

As shown in FIG. 1A, the flexible printed circuit board 130 includes a first end 131, a second end 132 opposite to the first end 131, and a main body portion 133 located between the first end 131 and the second end 132. The first end 131 of the flexible printed circuit board 130 is connected to a bonding region 1111 of the array substrate 111.

Figure 1B:
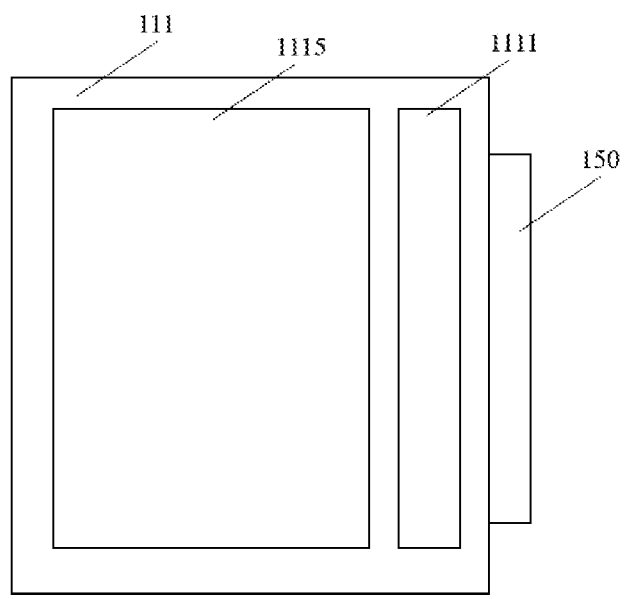
FIG. 1B shows a schematic top view of the array substrate and the first bending auxiliary structure in FIG. 1A.

FIG. 1B shows a schematic top view of the array substrate 111 and the first bending auxiliary structure 150 in FIG. 1A. As shown in FIG. 1B, the array substrate 111 includes a display region 1115 and at least one bonding region 1111. For example, the array substrate 111 may be a TFT substrate. The display region 1115 includes a pixel array, gate lines that provide scanning signals to the pixel array and data lines that provide data signals to the pixel array, etc. The at least one bonding region 1111 is located in a peripheral region outside the display region 1115, is located on a first side (the right side in FIG. 1A and FIG. 1B) of the array substrate 111, and includes a plurality of contact pads and leads electrically connected to the plurality of contact pads, respectively. For example, the gate lines of the display region 1115 are electrically connected to the leads in the corresponding bonding region (for example, a first bonding region), respectively, thereby being electrically connected to the contact pads in the bonding region. Furthermore, the data lines of the display region 1115 are electrically connected to the leads in the corresponding bonding region (for example, a second bonding region), respectively, thereby being electrically connected to the contact pads in the bonding region.

The first end 131 of the flexible printed circuit board 130 further includes contact pads. When the first end 131 of the flexible printed circuit board 130 is connected to the at least one bonding region 1111 of the array substrate 111, the contact pads of the first end 131 and the contact pads of the bonding region 1111 of the array substrate 111 are electrically connected one by one and fixed to each other, through an anisotropic conductive adhesive (ACA) for example. For example, the main body portion 133 of the flexible printed circuit board 130 includes leads, and the second end 132 of the flexible printed circuit board 130 includes a chip mounting structure. The main body portion 133 is connected to the integrated circuit chip 140 through the chip mounting structure. The integrated circuit chip 140 is electrically connected to the contact pads in the first end 131 through the leads in the main body portion 133, so that the integrated circuit chip 140 can further communicate with or electrically connect to the signal lines (for, the gate lines or the data lines) in the array substrate 111. For example, the integrated circuit chip 140 may be configured to control the display operation of the display panel 110.

In addition, in other embodiments, the second end 132 of the flexible printed circuit board 130 may further be connected to other electrical members, such as a printed circuit board, or not connected to any electrical components. The embodiments of the present disclosure are not limited to the specific structure and usage of the flexible printed circuit board 130.

As shown in FIG. 1A, the first bending auxiliary structure 150 is provided on the first side of the array substrate 111 and includes a first curved surface 151, for example, the first curved surface 151 includes a portion facing away from the array substrate 111. In the case where the first end 131 of the flexible printed circuit board 130 is connected to the array substrate 111, the main body portion 133 of the flexible printed circuit board 130 is bent around the first curved surface 151, so that the first end 131 and the second end 132 overlap in a direction perpendicular to the array substrate 111.

In the present embodiment, the array substrate 111 includes a first plate surface 1112 (the upper surface of the array substrate 111 in the figures) and a second plate surface 1113 (the lower surface of the array substrate 111 in the figures) opposite to the first plate surface 1112. The display region (that is, the pixel array) of the array substrate is located on the first plate surface 1112, and correspondingly, the bonding region 1111 is located on the first plate surface 1112.

In order to accomplish the display device 100 with a narrow frame, the flexible printed circuit board 130 is folded to a side (that is, the back side) of the second panel 1113 of the array substrate 111. Specifically, the flexible printed circuit board 130 is bent around the first bending auxiliary structure 150, so that the second end 132 is located at a side of the second plate surface 1113. Meanwhile, after being bent, the integrated circuit chip 140 is at the side of the flexible printed circuit board 130 remote from the array substrate 111.

As shown in FIG. 1A, the first bending auxiliary structure 150 is fixed to the first side surface 1114 located on the first side of the array substrate 111 and has a cross section with a semicircle shape. For example, in the embodiment shown in the figure, the diameter of the semicircle shape of the cross section is approximately equal to the thickness of the array substrate 111.

In the present embodiment, the first bending auxiliary structure 150 can be manufactured by a plastic material or a rubber material, for example, and the first curved surface 151 is a semi-cylindrical surface. In other embodiments, the first curved surface 151 may be a partial cylindrical surface other than a semi-cylindrical surface, or may be a partial elliptic cylindrical surface, or a partial parabolic cylindrical surface, etc. The embodiments of the present disclosure is not limited to the material for manufacturing of the first bending auxiliary structure 150 and the shape of the first curved surface 151.

In the case where the first bending auxiliary structure 150 is not provided, during the bending process of the flexible printed circuit board 130, the flexible printed circuit board 130 is usually bent along the side surface (here, is referred to the first side surface 1114 located on the first side) of the array substrate 111. Because the side surface of the array substrate 111 is perpendicular to the plate surface, the flexible printed circuit board 130 is easily cut and damaged by sharp corners of the side edges of the array substrate 111, resulting in breakage of the leads in the flexible printed circuit board 130 (for example, the main body portion). In at least one embodiment of the present disclosure, because the first bending auxiliary structure 150 has the first curved surface 151, the flexible printed circuit board 130 can smoothly transition during the bending process, which is beneficial to avoiding damage to the flexible printed circuit board 130.

At least a part of the main body portion 133 of the flexible printed circuit board may be in contact with the first curved surface 151 to be bent around the first curved surface 151, thereby being supported by the first curved surface 151. The at least part of the main body portion 133 may be in contact and engagement with the first curved surface 151, so that the main body 133 and the first curved surface 151 of the first bending auxiliary structure 150 are in more stable contact. For example, the at least part of the main body portion 133 may be adhered to the first curved surface 151 with an adhesive.

Figure 2A:
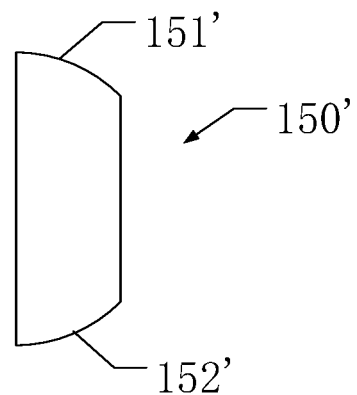
FIG. 2A shows a cross-sectional view of a bending auxiliary structure according to another embodiment of the present disclosure.

In other embodiments, the first bending auxiliary structure 150 may further have a plurality of curved surfaces. FIG. 2A shows a cross-sectional view of a bending auxiliary structure according to another embodiment of the present disclosure. As shown in FIG. 2A, a bending auxiliary structure 150' includes a curved surface 151' and a curved surface 152', and the curved surface 151' and the curved surface 152' are respectively located at the corners of an upper side and a lower side of the bending auxiliary structure 150', so that the width of the bending auxiliary structure itself (that is, the thickness in a transverse direction in the figure) can be reduced, and the weight of the bending auxiliary structure can be reduced. In the case where the flexible printed circuit board 130 is bent around the bending auxiliary structure 150', the flexible printed circuit board 130 can sequentially in contact with the curved surface 151' and the curved surface 152', thereby being smoothly bent.

Figure 2B:
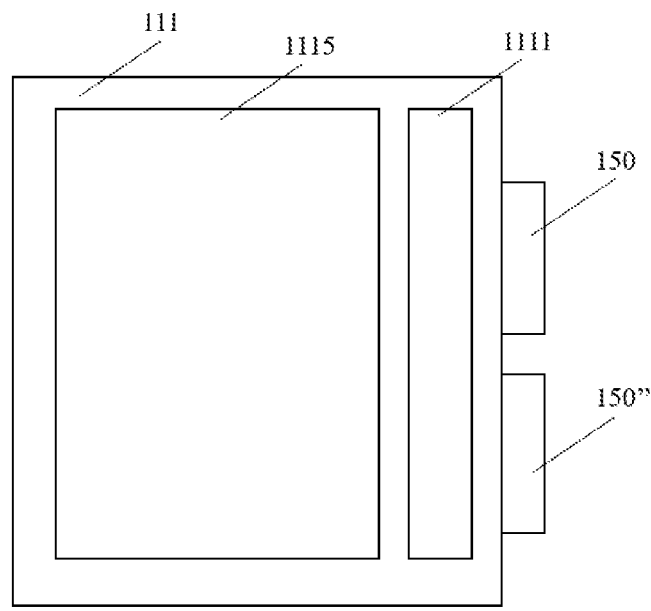
FIG. 2B shows a cross-sectional view of an array substrate and a first bending auxiliary structure according to another embodiment of the present disclosure.

In other embodiments, the number of the first bending auxiliary structure 150 may be multiple. For example, a display device 100 includes a first bending auxiliary structure 150 and a first bending auxiliary structure 150", as shown in FIG. 2B. The first bending auxiliary structure 150 and the first bending auxiliary structure 150" are arranged side by side along the first side surface 114 of the array substrate 111. The flexible printed circuit board 130 is bent around the first bending auxiliary structure 150 and the first bending auxiliary structure 150". Both the first bending auxiliary structure 150 and the first bending auxiliary structure 150" support the flexible printed circuit board 130 together.

In the present embodiment, the thickness of the first bending auxiliary structure 150 (that is, the diameter of the cross section with a semicircle shape) is equal to the thickness of the array substrate 111 in a direction perpendicular to the array substrate 111. In other embodiments, the thickness of the first bending auxiliary structure 150 may be smaller than or greater than the thickness of the array substrate 111. For example, when the thickness of the first bending auxiliary structure 150 is larger than the thickness of the array substrate 111, the curvature radius of the curve formed by bending of the flexible printed circuit board 130 becomes larger, which further reduces the probability of the flexible printed circuit board 130 being damaged. In addition, the thickness of the first bending auxiliary structure 150 can be designed in combination with the thickness of the display panel 110, which is beneficial not only to avoid larger thickness of the display panel 110, but also to achieve a smooth transition of the flexible printed circuit board 130 during the bending process.

The above-mentioned light incident into the display panel 110 may be ambient light. In a dark environment, the reflective display panel 110 cannot be used. Therefore, the front light module 120 may be provided on the light incident side of the display panel 110 to provide a light source incident to the display panel 110.

As shown in FIG. 1A, the front light module 120 of the display device 100 may include a light guide plate 121, a flexible light mix portion 122, and a light source module 123. Regarding the front light module 120, the light guide plate 121 is another example of the first base substrate of the embodiments of the present disclosure, and the flexible light mix portion 122 is another example of the flexible member of the embodiments of the present disclosure.

The light source module 123 is, for example, an elongated fluorescent lamp (for example, a cold cathode fluorescent lamp) or, for example, a light bar including at least one base substrate and a plurality of parallel light emitting diodes (LED) provided on the at least one base substrate.

The flexible light mix portion 122 includes a first end 1221, a second end 1222 opposite to the first end 1221, and a main body portion 1223 located between the first end 1221 and the second end 1222. The first end 1221 of the flexible light mix portion 122 is connected (for example, bonded, clamped, etc.) to a light guide plate connection portion 1211 of the light guide plate 121 to allow light emitted from the flexible light mix portion 122 to enter the light guide plate 121. The second end 1222 of the flexible light mix portion 122 is connected (for example, bonded, clamped, etc.) to the light source module 113, such that the light emitted from the light source module 113 is incident into the flexible light mix portion 122. The flexible light mix portion 122 may be, for example, an optical fiber, a flexible light guide plate, or etc., and may be manufactured by plastic or the like. The flexible light mix portion 122 is configured to mix light passing therethrough to cause the light more uniform. The light guide plate 121 is configured to substantially uniformly guide the light incident from the flexible light mix portion 122 into the display panel 110.

The light guide plate 121 is, for example, a glass substrate or a plastic substrate, and at least part of the light incident from the flexible light mix portion 122 is repeatedly total internal reflected between the upper surface and the lower surface of the light guide plate 121, and meanwhile propagating in a lateral direction. And the light guide plate 121 further includes, for example, concavo-convex structures uniformly or non-uniformly distributed (for example, convex points protruding outward or concave points concave inward) to allow light reaching these concavo-convex structures to exit from the light guide plate 121, thereby entering the display panel 110. The light guide plate 121 can transmit substantially all the light emitted from the display panel 110, and thus does not affect the display effect of the display panel 110.

As shown in FIG. 1A, the light guide plate 121 includes a first side (the left side in FIG. 1A) opposite to the first side of the array substrate 111. In other embodiments, the first side of the light guide plate 121 and the first side of the array substrate 111 may be the same side or on sides perpendicular to each other.

The second bending auxiliary structure 160 is provided at the first side of the light guide plate 121 and includes a second curved surface 161 (referring to FIG. 3A and FIG. 3B), and the second bending auxiliary structure 160 is another example of the bending structure of the embodiments of the present disclosure. The main body portion 1223 of the flexible light mix portion 122 is bent around the second curved surface 161, so that the first end 1221 and the main body portion 1223 are overlapped in a direction perpendicular to the light guide plate 121.

It should be noted that, for the example where the flexible light mix portion 122 is a flexible member, the first end 1221 of the flexible light mix portion 122 is overlapped with the main body portion 1223 in the direction perpendicular to the light guide plate 121. When the second end 1222 of the flexible light mix portion 122 is closer to the first side of the light guide plate 121 than the first end 1221, the first end 1221 may be overlapped with the second end 1222. For the above-described example where the flexible printed circuit board 130 is a flexible member, the first end 131 of the flexible printed circuit board 130 and the second end 132 of the flexible printed circuit board 130 are overlapped in a direction perpendicular to the array substrate 111. When the second end 132 of the flexible printed circuit board 130 is further away from the first side of the array substrate 111, the first end 131 may be overlapped with the main body portion 133. The first end of the flexible member and the second end of the flexible member or the first end and the main body portion of the flexible member according to the embodiments of the present disclosure are overlapped, but the present disclosure is not limited thereto.

The light guide plate 121 includes a first plate surface 1211 and a second plate surface 1212 opposite to the first plate surface 1211. The display panel 110 includes a side facing away from the light guide plate 121, that is, the side where the second plate surface 1113 of the array substrate 111 is located in the figure.

The display panel 110 includes a light emitting side and a back side opposite to the light emitting side. In the present embodiment, one side of the second panel 1113 of the array substrate 111 is the back side opposite to the light emitting side. The light guide plate 121 is provided at the light emitting side of the display panel 110. The flexible light mix portion 122 is bent around the second bending auxiliary structure 160 such that the second end 1222 of the flexible light mix portion 122 is located at the back side of the display panel 110, that is, one side of the second plate surface 1113 of the array substrate 111, thereby contributing to the realization of a narrow frame design.

In the present embodiment, the second bending auxiliary structure 160 sequentially crosses the color film substrate 112, the liquid crystal layer 113, and the array substrate 111 of the display panel 110 from the polarizer 114. The thickness of the second bending auxiliary structure 160 in the direction perpendicular to the light guide plate 121 is larger than the thickness of the display panel 110.

In the absence of the second bending auxiliary structure 160, the flexible light mix portion 122 is usually bent along the side surface of the display panel 110 during a bending process, because the side surface of the array substrate 111 is perpendicular to a plate surface, the flexible light mix portion 122 is easily cut and damaged by sharp corners of the side edges of the display panel 110, thereby resulting in breakage of the flexible light mix portion 122 (for example, the main body portion) and light leakage. Furthermore, the flexible light mix portion 122 may be damaged due to excessive bending curvature. In at least one embodiment of the present disclosure, the second bending auxiliary structure 160 has the second curved surface 161, so that the flexible light mix portion 122 can smoothly transition during the bending process, which is beneficial to avoiding the damage of the flexible light mix portion 122 and increasing the bending curvature radius of the flexible light mix portion 122.

Figure 3A:
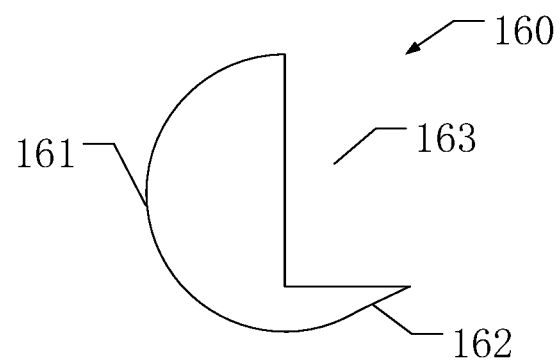
FIG. 3A shows a cross-sectional view of the second bending auxiliary structure in FIG. 1A.
Figure 3B:
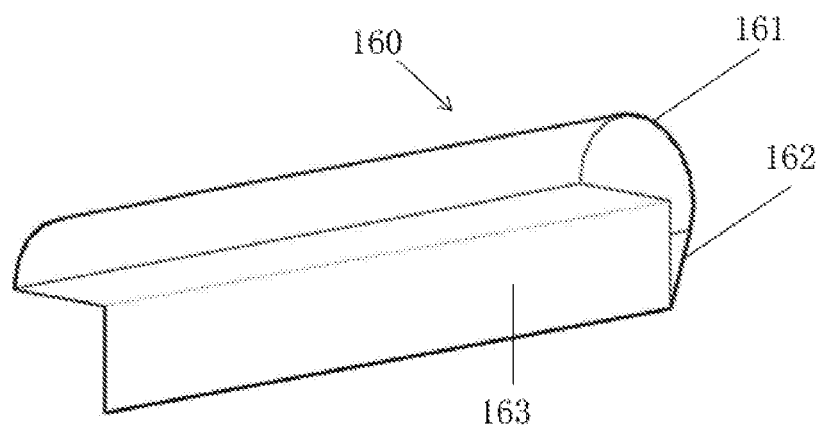
FIG. 3B shows a perspective view of the second bending auxiliary structure in FIG. 1A.

FIG. 3A shows a cross-sectional view of the second bending auxiliary structure 160 in FIG. 1A. FIG. 3B shows a perspective view of the second bending auxiliary structure 160 in FIG. 1A. As shown in FIG. 3A and FIG. 3B, in addition to the second curved surface 161, the second bending auxiliary structure 160 includes an extension surface 162 connected to the second curved surface 161, and the flexible light mix portion 122 extends along the extension surface 162 after bending around the second curved surface 161. The provision of the extension surface 162 can further reduce the probability that the flexible light mix portion 122 is damaged after being bent.

In addition, the second bending auxiliary structure 160 further includes a combination portion which is configured to connect the second bending auxiliary structure 160 with a side surface of the display panel 110, for example, the combination portion may include a concave portion 163. The concave portion 163 is configured to contact at least one of the plate-shaped members (including the array substrate 111, the liquid crystal layer 113, the color film substrate 112, and the polarizer 114) in the display panel 110, thereby fixing the second bending auxiliary structure 160 to the side surface of the display panel 110.

For example, in other embodiments, the concave portion 163 may further be configured to contact some plate-shaped members in the display panel 110. In other embodiments, the concave portion 163 may be configured to have an irregular shape to match the side surface to which the concave portion 163 is fixed. In other embodiments, the combination portion may further include a protrusion portion or both a concave portion and a protrusion portion.

At least a part of the main body portion 1223 of the flexible light mix portion 122 may in contact with the second curved surface 161 to be bent around the second curved surface 161, thereby being supported by the second curved surface 161. The at least part of the main body portion 1223 may be in contact and engagement with the second cambered surface 161, so that the main body 1223 and the second cambered surface 161 of the second bending auxiliary structure 160 are in more stable contact. For example, the at least part of the main body portion 1223 may be adhered to the second curved surface 161 with an adhesive.

In the embodiments as shown in FIG. 1A, FIG. 3A, and FIG. 3B, the display panel 110 may be regarded as an example of the second base substrate of the embodiments of the present disclosure with respect to the front light module 120. As shown in the figure, the second end 1222 of the flexible light mix portion 122 is located at a side of the second plate surface 1113 of the array substrate 111 after being bent, and the light source module 123 can be fixedly provided on the second plate surface 1113.

In the above, the reflective liquid crystal display panel has been described as an example of the display panel of the embodiments of the present disclosure in conjunction with the accompanying drawings, but the embodiments of the present disclosure is not limited thereto. The display panel of the embodiments of the present disclosure is not limited to a reflective display panel, but may also be a transmissive display panel or a transflective display panel. For example, in the case of the transmissive display panel, the front light module becomes unnecessary. The display panel of the embodiments of the present disclosure is also not limited to a liquid crystal panel, for example, an electronic paper display panel, an organic light emitting diode (OLED) display panel, a quantum dot light emitting diode (QLED) display panel, etc. For example, in the case of an electronic paper display panel, the front light module 120 may still be provided and configured to provide display light, while in the case of the OLED display panel or the QLED display panel, the front light module is no longer required, and the color film substrate may become unnecessary, or may include a packaging substrate provided opposite to the array substrate.

Figure 4:
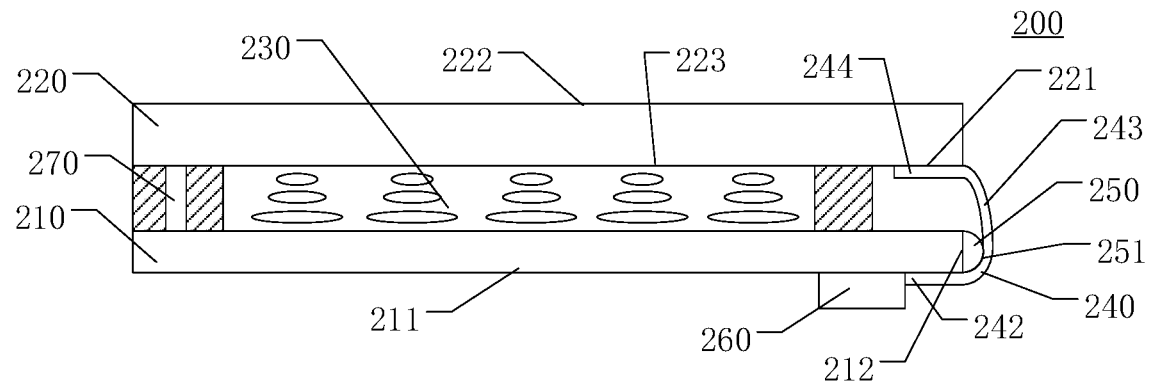
FIG. 4 shows a cross-sectional view of at least a part of a display device according to another embodiment of the present disclosure.

FIG. 4 shows a cross-sectional view of at least a part of a display device according to another embodiment of the present disclosure. As shown in FIG. 4, the display device 200 includes a color film substrate 220, an array substrate 210, a liquid crystal layer 230, a flexible printed circuit board 240, an integrated circuit chip 260, and a bending auxiliary structure 250. The liquid crystal layer 230 is provided between the color film substrate 220 and the array substrate 210. In the present embodiment, the color film substrate 220 is an example of a first base substrate, the array substrate 210 is an example of a second base substrate, and the flexible printed circuit board 240 is an example of a flexible member of the embodiments of the present disclosure.

The color film substrate 220 includes a first side (the right side in FIG. 4). The color film substrate 220 may include a display region and a bonding region 221 provided at the first side. The display region includes a pixel array (for example, a color film unit array). The bonding region 221 is located in a peripheral region outside the display region and includes a plurality of contact pads and leads electrically connected to the contact pads, respectively. As shown in FIG. 4, the color film substrate 220 includes a first plate surface 222 and a second plate surface 223, and the bonding region 221 is located on the second plate surface 223. The second plate surface 223 faces the array substrate 210.

The array substrate 210 also includes a display region and a peripheral region, and the display region includes a pixel array, gate lines for providing scanning signals to the pixel array, data lines for providing data signals to the pixel array, etc. The gate lines, the data lines, etc., in the display region may be electrically connected to the leads on the color film substrate 220, respectively, through conductive connection portions 270 provided in the peripheral region.

The flexible printed circuit board 240 includes a first end 241, a second end 242 opposite to the first end 241, and a main body portion 243 located between the first end 241 and the second end 242.

The first end 241 of the flexible printed circuit board 240 is connected to the bonding region 221 of the color film substrate 220 at the first side. The second end 242 of the flexible printed circuit board 240 is connected to the integrated circuit chip 260.

The bending auxiliary structure 250 includes a first curved surface 251. The main body portion 243 of the flexible printed circuit board 240 is bent around the first curved surface 251 of the bending auxiliary structure 250, so that the first end 241 and the second end 242 are partially overlapped in a direction perpendicular to the color film substrate 220.

The array substrate 210 includes a third plate surface 211 facing away from the color film substrate 220. As shown in FIG. 4, the flexible printed circuit board 240 is bent around the bending auxiliary structure 250, so that the second end 242 is located on a side of the third plate surface 211 of the array substrate 210.

In the present embodiment, the bending auxiliary structure 250 is provided at the first side surface 212 located on the first side of the color film substrate 220. The bending auxiliary structure 250 is beneficial to prevent the flexible printed circuit board 240 from being damaged. In other embodiments, the bending auxiliary structure 250 may further be provided across the liquid crystal layer 230 and the array substrate 210.

A part of the main body portion 243 of the flexible printed circuit board 240 contacts with the first curved surface 251 to be bent around the first curved surface 251, thereby being supported by the first curved surface 251. The part of the main body portion 243 is in contact and engagement with the first curved surface 251 to cause the main body portion 243 in more stable contact with the first curved surface 251 of the bending auxiliary structure 250. For example, the part of the main body portion 243 may be adhered to the first curved surface 251 with an adhesive.

Figure 5:
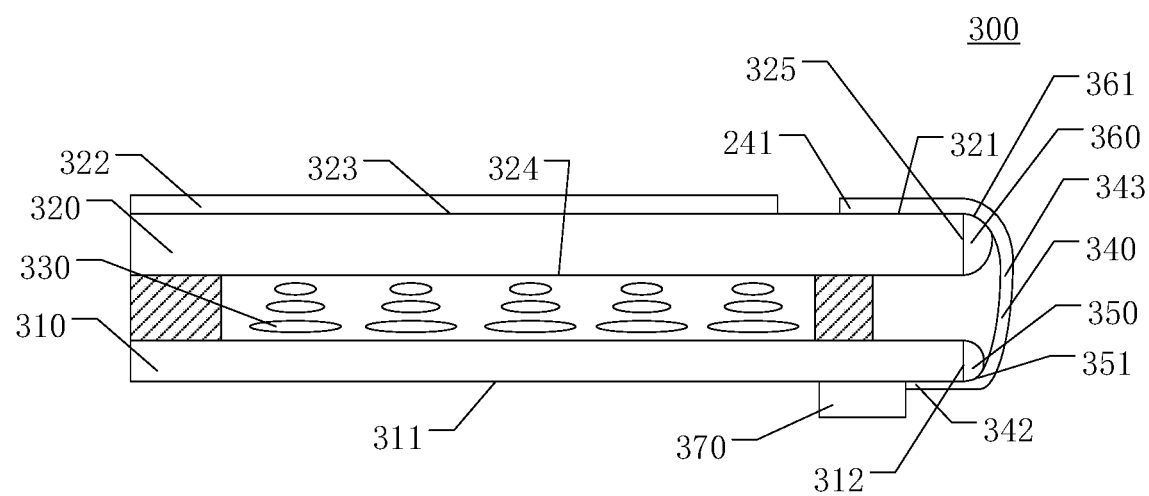
FIG. 5 shows a cross-sectional view of at least a part of a display device according to another embodiment of the present disclosure.

FIG. 5 shows a cross-sectional view of at least a part of a display device 300 according to another embodiment of the present disclosure. As shown in FIG. 5, the display device 300 includes a color film substrate 320, an array substrate 310, a liquid crystal layer 330, a flexible printed circuit board 340, an integrated circuit chip 370, a first bending auxiliary structure 350, and a second bending auxiliary structure 360. The liquid crystal layer 330 is provided between the color film substrate 320 and the array substrate 310. In the present embodiment, the color film substrate 320 is an example of a first base substrate, the array substrate 310 is an example of a second base substrate, the flexible printed circuit board 340 is an example of a flexible member of the embodiments of the present disclosure, and the first bending auxiliary structure 350 and the second bending auxiliary structure 360 are examples of a bending auxiliary structure of the embodiments of the present disclosure.

The color film substrate 320 includes a first side (the right side in FIG. 5) and a touch circuit structure 322. The color film substrate 320 includes a bonding region 321 provided at the first side, and the bonding region 321 includes leads electrically connected to the touch circuit structure 322 of the color film substrate 320 and contact pads correspondingly connected to the leads. As shown in FIG. 5, the color film substrate 320 includes a first plate surface 323 and a second plate surface 324 opposite to the first plate surface 323. The bonding region is located on the first plate surface 323, and the first plate surface 323 faces away from the array substrate 310.

The touch circuit structure 322 is provided on the first plate surface 323 of the color film substrate 320, therefore in the present embodiments, the color film substrate 320 serves as the base substrate of the touch circuit structure 322. That is, the color film substrate 320 and the touch circuit structure 322 provide a touch panel as a whole.

The touch circuit structure 322 may be of various types, such as resistive type, capacitive type, etc. Further, the touch circuit structure of the capacitive type may be divided into self-capacitance type or mutual capacitance type, etc. For example, the touch circuit structure of the mutual capacitance type comprises a plurality of touch scanning lines extending along a first direction and a plurality of touch sensing lines extending along a second direction, and the first direction and the second direction intersect. Each of the touch scanning lines is electrically connected to the corresponding contact pad in the bonding region through a lead, and each of the touch sensing lines is electrically connected with the corresponding contact pad in the bonding region through a lead. The first bending auxiliary structure 350 and the second bending auxiliary structure 360 are arranged in parallel at the first side of the color film substrate 320.

The flexible printed circuit board 340 includes a first end 341, a second end 342 opposite to the first end 341, and a main body portion 343 located between the first end 341 and the second end 342.

The first end 341 of the flexible printed circuit board 340 is connected to the bonding region 321 of the color film substrate 320 on the first side. The second end 342 of the flexible printed circuit board 340 is connected to the integrated circuit chip 370. The first end 341 of the flexible printed circuit board 340 also includes contact pads. When the first end 341 of the flexible printed circuit board 340 is connected to the bonding region 321 of the color film substrate 321, the contact pads of the first end 341 and the contact pads of the bonding region 321 of the color film substrate 321 are electrically connected one by one and fixed to each other, through an anisotropic conductive adhesive (ACA) for example. For example, the main body portion of the flexible printed circuit board 340 includes leads. The second end 342 of the flexible printed circuit board 340 includes a chip mounting structure, thereby being connected to the integrated circuit chip 370 through the chip mounting structure, and the integrated circuit chip 370 is electrically connected to the contact pads in the first end through the leads in the main body portion, so that the integrated circuit chip 370 can further communicate with or electrically connect to signal lines (for example, gate lines or data lines) in the array substrate 111. For example, the integrated circuit chip 370 is, for example, a touch processing chip.

More specifically, the first bending auxiliary structure 350 includes a first curved surface 351. The second bending auxiliary structure 360 includes a second curved surface 361. The first curved surface 351 and the second curved surface 361 are semi-cylindrical surfaces, for example, the diameter of the first curved surface 351 and the diameter of the second curved surface 361 are substantially the same. The main body portion 343 of the flexible printed circuit board 340 is bent around the first curved surface 351 of the first bending auxiliary structure 350 and the second curved surface 361 of the second bending auxiliary structure 360, so that the first end 341 and the second end 342 are partially overlapped in a direction perpendicular to the color film substrate 320.

The array substrate 310 includes a third plate surface 311 facing away from the color film substrate 320. As shown in FIG. 5, the flexible printed circuit board 340 is bent around the first bending auxiliary structure 350 and the second bending auxiliary structure 360, so that the second end 342 is located at a side of the third plate surface 311 of the array substrate 310.

In the present embodiment, the display device 300 includes a first bending auxiliary structure 350 and a second bending auxiliary structure 360. The first bending auxiliary structure 350 and the second bending auxiliary structure 360 are provided at the first side of the color film substrate 320, and support the main body portion 343 of the flexible printed circuit board 340 together to avoid bending damage of the main body portion 343, and to avoid adopting a single bending auxiliary structure with a relatively large outer shape under the condition that the display panel is relatively thick, due to the light and thin design.

In the present embodiment, the first bending auxiliary structure 350 is provided on the first side surface 312 of the array substrate 310 at the first side, and the second bending auxiliary structure 360 is provided at the second side surface 325 located on the first side of the color film substrate 320.

A part of the main body portion 343 of the flexible printed circuit board 340 is in contact with the first curved surface 351 to be bent around the first curved surface 351, thereby being supported by the first curved surface 351. The other part of the main body portion 343 of the flexible printed circuit board 340 is in contact with the second curved surface 361 to be bent around the second curved surface 361, thereby being supported by the second curved surface 361.

The protection scope of the present disclosure is not limited by the embodiments described above, but is defined by the appended claims and their equivalents.

What is claimed is:

1. An electronic device, comprising:
a first base substrate, comprising a first side;
a flexible member, comprising a first end, a second end opposite to the first end, and a main body portion located between the first end and the second end, wherein the first end is connected to the first base substrate at the first side; and
a bending auxiliary structure, provided at the first side and comprising at least one curved surface,
wherein the main body portion is bent around the at least one curved surface,
wherein the first base substrate comprises a light guide plate, and the light guide plate comprises a light guide plate connection portion provided at the first side,
the flexible member comprises a flexible light mix portion, and the first end is connected to the light guide plate connection portion, to allow a light emitted by the flexible light mix portion to enter the light guide plate.

2. The electronic device according to claim 1, wherein the first end and the main body portion, or the first end and the second end are at least partially overlapped in a direction perpendicular to the first base substrate.

3. The electronic device according to claim 1, further comprising:
a light source module,
wherein the light source module is connected to the second end, and configured such that the light emitted by the light source is capable of being incident into the flexible light mix portion.

4. The electronic device according to claim 1, further comprising:
a display panel, comprising a light emitting side and a back side opposite to the light emitting side,
wherein the first base substrate is provided at the light emitting side of the display panel, and the flexible light mix portion is bent around the bending auxiliary structure such that the second end is located at the back side of the display panel.

5. The electronic device according to claim 4, wherein the display panel is a reflective display panel.

6. The electronic device according to claim 1, wherein the curved surface is a partial cylindrical surface, a partial elliptic cylindrical surface, or a partial parabolic cylindrical surface.

7. The electronic device according to claim 1,
wherein the bending auxiliary structure further comprises an extension surface, and
the extension surface is connected to the curved surface, and the main body portion is extended along the extension surface after being bent around the curved surface.

8. The electronic device according to claim 1,
wherein at least a part of the main body portion is in contact with the curved surface to be bent around the curved surface.

9. The electronic device according to claim 1,
wherein at least part of the main body portion is adhered to the curved surface with an adhesive.

10. The electronic device according to claim 1,
wherein the bending auxiliary structure further comprises a combination portion, the combination portion comprises a concave portion, which is configured to contact at least one of plate-shaped members which are crossed by the flexible member when the flexible member is bent, to position the bending auxiliary structure at a side surface of the plate-shaped members which are crossed by the flexible member when the flexible member is bent.

11. The electronic device according to claim 10,
wherein in a direction perpendicular to the first base substrate, a thickness of the bending auxiliary structure is greater than or equal to a thickness of the plate-shaped members which are crossed by the flexible member when the flexible member is bent.

12. The electronic device according to claim 3, further comprising:
a display panel, comprising a light emitting side and a back side opposite to the light emitting side,
wherein the first base substrate is provided at the light emitting side of the display panel, and the flexible light mix portion is bent around the bending auxiliary structure such that the second end is located at the back side of the display panel.

* * * * *